United States Patent
Hemminger et al.

(12)

(10) Patent No.: US 6,229,295 B1
(45) Date of Patent: *May 8, 2001

(54) APPARATUS FOR METERING AT LEAST ONE TYPE OF ELECTRICAL POWER OVER A PREDETERMINED RANGE OF SERVICE VOLTAGES

(75) Inventors: Rodney C. Hemminger; Mark L. Munday, both of Raleigh, NC (US); Fred F. Schleifer, Elk Mound, WI (US)

(73) Assignee: ABB Power T&D Company Inc., Raleigh, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/047,479

(22) Filed: Mar. 25, 1998

Related U.S. Application Data (63) Continuation of application No. 08/478,605, filed on Jun. 7, 1995, now Pat. No. 5,903,145, which is a continuation of application No. 08/384,398, filed on Feb. 3, 1995, now Pat. No. 5,457,621, which is a continuation of application No. 08/259,116, filed on Jun. 10, 1994, now abandoned, which is a continuation of application No. 07/839,967, filed on Feb. 21, 1992, now abandoned.

(51) Int. Cl.[7] ................................................. G01R 7/00
(52) U.S. Cl. ........................................... 324/142; 324/141
(58) Field of Search ................................ 702/60, 61, 62, 702/64, 65; 324/141, 142

(56) References Cited

U.S. PATENT DOCUMENTS

| | | |
|---|---|---|
| 3,976,941 | 8/1976 | Milkovic ........................... 324/142 |
| 4,007,061 | 2/1977 | Le Couturier . |

(List continued on next page.)

FOREIGN PATENT DOCUMENTS

| | | |
|---|---|---|
| 68113/87 | 8/1987 | (AU) . |
| 0 288 413 | 10/1990 | (EP) . |

(List continued on next page.)

OTHER PUBLICATIONS

Landis & Gyr, *ZMA 110m402—Solid State Precision Meter IEC Class 1.0* (Date Unavailable).

(List continued on next page.)

*Primary Examiner*—Safet Metjahic
*Assistant Examiner*—Russell M. Kobert
(74) *Attorney, Agent, or Firm*—Woodcock Washburn Kurtz Mackiewicz & Norris

(57) ABSTRACT

An apparatus for metering electrical energy over a predetermined range of voltages within a single meter. The meter includes a divider network for dividing the voltage to generate a divided voltage. The divided voltage is substantially linear with minimal phase shift over the wide dynamic range. A processing unit processes the divided voltage and a current component to determine metered electrical power. A power supply receives the voltage component and generates a supply voltage from the voltage component over the predetermined range to power the processing unit. The power supply may include a transformer having first, second and third windings, so that the voltage component is provided to the first winding and the second winding defines the output of the power supply. A switching member is connected to the first winding for permitting and preventing the flow of current through the first winding. The switch member is operable in response to a control signal, which disables the switch member, that is generated by a controller in response to the output of the power supply.

16 Claims, 6 Drawing Sheets

U.S. PATENT DOCUMENTS

| | | |
|---|---|---|
| 4,077,061 | 2/1978 | Johnston et al. ............. 364/483 |
| 4,092,592 | 5/1978 | Milkovic ...................... 324/142 |
| 4,096,436 | 6/1978 | Cook et al. ................... 324/142 |
| 4,156,273 | 5/1979 | Sato .............................. 363/56 |
| 4,156,931 | 5/1979 | Adelman et al. . |
| 4,209,826 | 6/1980 | Priegnitz ......................... 363/21 |
| 4,301,508 | 11/1981 | Anderson et al. ............. 364/483 |
| 4,355,361 | 10/1982 | Riggs et al. . |
| 4,378,524 | 3/1983 | Steinmuler ..................... 324/107 |
| 4,389,702 | 6/1983 | Clemente et al. ............... 363/56 |
| 4,420,721 * | 12/1983 | Dorey et al. ................... 324/110 |
| 4,437,059 | 3/1984 | Hauptmann .................... 324/142 |
| 4,438,485 | 3/1984 | Voigt .............................. 363/21 |
| 4,497,017 | 1/1985 | Davis ............................. 363/21 |
| 4,509,128 | 4/1985 | Coppola et al. ............... 364/483 |
| 4,566,060 | 1/1986 | Hoeksma ....................... 363/97 |
| 4,607,320 | 8/1986 | Matui et al. .................... 363/97 |
| 4,622,627 | 11/1986 | Rodriguez et al. .............. 363/21 |
| 4,623,960 | 11/1986 | Eng ................................ 363/56 |
| 4,700,280 | 10/1987 | Onda et al. .................... 363/131 |
| 4,713,608 | 12/1987 | Catiller .......................... 324/142 |
| 4,754,219 * | 6/1988 | Milkovic ....................... 324/142 |
| 4,761,725 | 8/1988 | Henze ............................ 363/46 |
| 4,794,369 | 12/1988 | Haferd . |
| 4,803,632 | 2/1989 | Frew et al. . |
| 4,866,587 | 9/1989 | Wadlington .................... 363/97 |
| 4,896,106 | 1/1990 | Voisine et al. ................. 324/142 |
| 4,902,964 | 2/1990 | Szabela et al. . |
| 4,922,399 | 5/1990 | Tsuzki ........................... 363/56 |
| 4,931,725 | 6/1990 | Hutt et al. ...................... 324/142 |
| 4,949,029 | 8/1990 | Cooper et al. .................. 324/74 |
| 4,951,052 | 8/1990 | Jacob et al. . |
| 4,956,761 | 9/1990 | Higashi .......................... 363/97 |
| 4,975,592 | 12/1990 | Hahn et al. ..................... 363/21 |
| 4,977,368 | 12/1990 | Munday et al. . |
| 4,978,911 | 12/1990 | Perry et al. .................... 324/142 |
| 4,998,061 * | 3/1991 | Voisine et al. ................. 324/142 |
| 5,017,860 | 5/1991 | Germer et al. ................. 324/142 |
| 5,019,955 | 5/1991 | Hoeksma ....................... 363/97 |
| 5,032,785 | 7/1991 | Mathis et al. .................. 324/107 |
| 5,059,896 | 10/1991 | Germer et al. ................. 324/142 |
| 5,122,735 | 6/1992 | Porter et al. ................... 324/142 |
| 5,140,511 | 8/1992 | Lee et al. ....................... 363/21 |
| 5,173,657 | 12/1992 | Holdsclaw . |
| 5,175,675 | 12/1992 | Uramoto ........................ 363/131 |
| 5,181,026 | 1/1993 | Granville ...................... 340/870.28 |
| 5,229,713 | 7/1993 | Bullock et al. ................ 324/142 |
| 5,245,275 | 9/1993 | Germer et al. ................. 324/142 |
| 5,287,287 | 2/1994 | Chamberlain et al. ......... 364/483 |
| 5,315,527 | 5/1994 | Beckwith ...................... 364/483 |
| 5,325,051 | 6/1994 | Germer et al. ................. 324/142 |
| 5,391,983 | 2/1995 | Lusignan et al. .............. 324/142 |
| 5,548,209 | 8/1996 | Lusignan et al. .............. 324/142 |
| 5,903,145 * | 5/1999 | Hemminger et al. .......... 324/142 |

FOREIGN PATENT DOCUMENTS

| | | |
|---|---|---|
| 0 462 045 | 12/1991 | (EP) . |
| 61-11680 | 1/1986 | (JP) . |
| 61-38569 | 2/1986 | (JP) . |
| 61-284670 | 12/1986 | (JP) . |
| 1-239473 | 9/1989 | (JP) . |
| 1-239474 | 9/1989 | (JP) . |
| 1-239475 | 9/1989 | (JP) . |

OTHER PUBLICATIONS

Landis & Gyr, *Bulletin 930 SSM2 Instruction/Technical Manual Polyphase Solid State Meter*, Landis & Gyr, Lafayette, Indiana. (Date Unavailable).

Landis & Gyr, *Bulletin 920 SSM Instruction/Technical Solid State Meter Class 20 Form 9S*, First Publication 3/1987.

McGrath, Donald T., *Signal Processing Considerations in Power Management Applications*, GE Corporate Research and Development, 1991. (Month Unavailable).

"Three–Phase, Watt–Hour Meter IC," *Electronic Design*, Feb. 23, 1989.

Garverick, Steven L., et al., "A Programmable Mixed–Signal ASIC for Power Metering," *IEEE Journal of Solid–State Circuits*, vol. 26, No. 12, Dec. 1991.

Gaverick, Steven L., et al., "A Programmable Mixed–Signal ASIC for Power Metering," *IEEE International Solid–State Circuits Conference*, 1991. (Month Unavailable).

Summers, R., *Integrated Semiconductor Solutions for Metering and Telemetering Applications*, Texas Instruments, Apr. 1990.

Negahaban, M., *A DSP Based Watthour Meter*, Silicon Systems,Inc., Nov. 23, 1988.

*In the Matter of Australian Patent Application No. 688711 in the name of ABB Power T & D Company, Inc., and In the Matter of Opposition thereto by Electrowatt Technology Innovation Corporation*, "Statement of Grounds and Particulars in Support of Opposition," Aug. 12, 1998.

Nilsen, "EMS 2100 Electricity Consumption Analyser—Australian Design Award 1988" pp. 1–16 (Month Unavailable).

*QUAD4® Plus Multifunction Electronic Meter*, User's Guide, Document A–117350, Revision L, Process Systems, Charlotte, NC, 1993. (Month Unavailable).

M. Schwendtner, et al., "Elektronischer Haushaltszähler" *Elektrontechnische Zeitschrift etz*, vol. 112, No. 6–7, 1991, pp. 320–323, together with an English translation of the same ("Electronic Domestic Meter"). (Date Unavailable).

Steven L. Garverick et al., "A Programmable Mixed–Signal ASIC of Power Metering," ISSCC91/Session 2/Low–Temperature Circuits and Special–Purpose Processors/Paper WP 2.4, IEEE International Solid–State Circuits Conference, 1991. (Month Unavailable).

*Quantum Multi–Function Polyphase Meter Type SQ400*, Preliminary Instruction Manual Draft III, Mar. 1983.

*ST–Q101 Series Electronic Meter*, Product Bulletin 10253, Schlumberger Industries, Sep. 1988.

*ST–Q200 Series System Measurement*, Product Bulletin 10255, Schlumberger Industries, Sep. 1988.

*Quantum™ Technical Guide*, Jul. 1989.

*ST–Q200 Series System Measurement*, Product Bulletin 10255, Schlumberger Industries, Nov. 1990.

*Quantum® Electronic Meter Field Reference Manual For Q101, Q111, Q121, Q200, Q210, Q220 and Q230 Electronic Meters*, Schlumberger Industries, (Date Unknown).

*ST–MT100 Electronic Time–of–Use Instruction Manual 0505*, Sangamo Westing, Inc., May 1987.

*MT100 Electronic Time–of–Use Register Instruction Manual 0505*, Schlumberger Industries, Dec. 1991.

*ST–DS130 Recorder Module Product Bulletin 13157*, Schlumberger Industries, Sep. 1988.

Negahban, M. et al., "A DSP–based Watthour Meter," IEEE International Solid–State Circuits Conference. Digest of Technical Papers. 36th ISSC. 1st Ed., NY, NY USA, Feb. 15–17, 1989.

Usenko, V.V. et al., "Meter For Recording the Energy of Single and Rarely–Repeating Ultrahigh–Energy Pulses," Radiotekhnika, Kharkov, Ukrainian SSR, No. 86, pp. 44–48, 1988, 2 REF. [abstract only] (Month Unavailable).

Landis & Gyr Instruction/Technical Manual, Solid State Meter Class 20, Form 9S, Bulletin 920, Lafayette, IN (Date Unavailable).

\* cited by examiner

Fig. 1

_Fig. 2_

_Fig. 3_

APPARATUS FOR METERING AT LEAST ONE TYPE OF ELECTRICAL POWER OVER A PREDETERMINED RANGE OF SERVICE VOLTAGES

RELATED APPLICATION DATA

This application is a continuation of U.S. patent application Ser. No. 08/478,605, filed Jun. 7, 1995, now U.S. Pat. No. 5,903,145, which is a continuation of U.S. patent application Ser. No. 08/384,398, filed Feb. 3, 1995, now U.S. Pat. No. 5,457,621, which is a continuation of U.S. patent ppplication Ser. No. 08/259,116, filed Jun. 10, 1994, now abandoned, which is a continuation of U.S. patent application Ser. No. 07/839,967, filed Feb. 21, 1992, now abandoned.

FIELD OF THE INVENTION

The present invention relates generally to the field of electric utility meters. More particularly, the present invention relates to electronic utility watthour meters or meters utilized to meter real and reactive energy in both the forward and reverse directions.

BACKGROUND OF THE INVENTION

Electric utility companies and power consuming industries have in the past employed a variety of approaches to metering electrical energy. Typically, a metering system monitors power lines through isolation and scaling components to derive polyphase input representations of voltage and current. These basic inputs are then selectively treated to determine the particular type of electrical energy being metered. Because electrical uses can vary significantly, electric utility companies have requirements for meters configured to analyze several different nominal primary voltages. The most common of these voltages are 120, 208, 240, 277 and 480 volts RMS. Presently, available meters have a different style for each of these applications, both electro-mechanical and electronic. This forces the electric utility companies to inventory, test and maintain many different styles of meters. Consequently, a need exists for reducing the number of meter types a utility need inventory by providing a meter capable of operation over a wide dynamic range.

The problem of wide amperage dynamic range was addressed in U.S. Pat. No. 3,976,941—Milkovic. It was there recognized that solid state electronic meters were becoming more desirable in metering applications, however, such solid state meters had a critical drawback in their amperage dynamic range. An effort was described to improve the amperage dynamic range of solid state meters so that such meters would be operationally equivalent to prior electromechanical meters. The problem with such meters, however, was their failure to address the multiple voltage situation. Utility companies utilizing such meters would still be forced to inventory, test and maintain many different styles of meters in order to service the various voltages provided to customers.

It has been recognized in various meter proposals that the use of a microprocessor would make metering operations more accurate. It will be understood, however, that the use of a microprocessor requires the provision of one or more supply voltages. Power supplies capable of generating a direct current voltage from the line voltage have been used for this purpose. Since electric utility companies have requirements for various nominal primary voltages, it has been necessary to provide power supplies having individualized components in order to generate the microprocessor supply voltages from the nominal primary voltage.

Consequently, a need exists for a single meter which is capable of metering electrical energy associated with nominal primary voltages in the range from 96 to 528 volts RMS. Applicants resolve the above problems through the use of a switching power supply and voltage dividers. It will be recognized that switching power supplies are known. However, the use of such a power supply in an electrical energy meter is new. Moreover, the manner of the present invention, the particular power supply construction and its use in an electrical energy meter is novel.

It will also be noted, in order to solve the inventory problem, designing a wide voltage range meter in the past involved the use of voltage transformers to sense line voltage. A significant problem associated with the use of such transformers was the change in phase shift and the introduction of non-linearities that would occur over a wide voltage range. It was not easy to remove such a widely changing phase shift or to compensate for the non-linearities.

Consequently, a need still exists for a single meter which is capable of metering electrical energy associated with nominal primary voltages that also minimizes phase shift in the voltage sensors over a wide voltage range.

SUMMARY OF THE INVENTION

The previously described problem is resolved and other advantages are achieved in an apparatus for metering at least one type of electrical power over a predetermined range of service voltages which comprises a voltage input circuit which divides a voltage component to a divided voltage, a current input circuit which produces an induced current proportional to the current component, a processing unit which processes the divided voltage and the induced current to determine the at least one type of electrical power, and a power supply which receives a voltage component within a predetermined range of power supplies and generates a supply voltage from the voltage component.

In accordance with a feature of the present invention, the power supply further comprises a transformer having first and second windings, a switching device connected to the first winding for permitting and preventing the flow of current through the first winding, and a controller connected to the switching device for generating the control signal in response to the output of the power supply. An input voltage is provided to the first winding so that current flows through the first winding and the second winding defines the output of the power supply, and the switching device is operable in response to a control signal. The transformer may further comprise a third winding that is substantially similar to the second winding so that the voltage across the third winding is similar to the voltage across the second winding. In accordance with this feature, the controller generates the control signal based on the voltage across the third winding, and the control signal operates to disable the switching member.

In accordance with another feature, the power supply may further comprising a bridge rectifier and protection circuit connected to receive the input voltage where the bridge rectifier rectifies the input voltage to produce an unregulated voltage, and the protection circuit directs the input voltage away from the first winding and disables the switching device when the input voltage exceeds a desired level. The protection circuit may comprise first and second transistors and a biasing device connected to the first and second transistors. The biasing device biases the first and second transistors so that the voltage provided by the protection circuit does not exceed a desired level. In addition, the protection circuit may be connected in series with the transformer and the switching member.

In accordance with still another feature, the apparatus may further comprise a non-volatile power source, such as a battery or a capacitor, and a reference voltage generator which generates a reference voltage. The voltage input circuit may be connected to the reference voltage generator such that the voltage input circuit references the divided voltage to the reference voltage.

In accordance with yet another feature, the apparatus may further comprising a charge storage device, connected to the second winding, which stores an electrical charge when current is flowing through the first winding and discharges stored electrical charge when the switching member interrupts current flowing through the first winding.

In accordance with another feature of the present invention, the electrical power may comprise polyphase power comprising a plurality of phases of voltage and current components, and wherein the power supply is connected to receive one phase of the plurality of phases of voltage as the input voltage. The voltage input circuit may comprise a plurality of resistive divider networks, each of the plurality of resistive divider networks receiving a different one of the plurality of phases of the voltage component, and the current input circuit may comprise a plurality of current transformers, each of the plurality of current transformers receiving a different one of the plurality of phases of the current component.

In accordance with yet another feature, the controller may comprise a current-mode regulator, wherein a current reference signal is generated by the current-mode regulator. The controller may comprise an oscillator having a predetermined pulse width. In addition, the output of the power supply may be input to a regulator to produce a regulated supply voltage.

In accordance with still another feature of the present invention, the supply voltage is a fixed predetermined voltage that is generated by the power supply independent of the magnitude of the supply voltage component.

According to another aspect of the present invention, there is provided a power supply for an apparatus for metering at least one type of electrical power over a predetermined range of service voltages supplied by electrical service providers, where the apparatus comprises a voltage input circuit connected to receive a voltage component, and a processing unit. The power supply comprises a surge protection circuit which receives an input voltage, a rectifier circuit which receives an alternating current voltage from the surge protection circuit and outputs a rectified direct current voltage, a transformer which receives the rectified direct current voltage at a first winding so that current flows through the first winding, and a second winding defines an unregulated output voltage of the power supply, a switching device for permitting and preventing the flow of current through the first winding in response to a control signal, and a controller for generating the control signal based on the voltage across the third winding. The control signal output by the controller operates to disable the switching member.

According to feature of the present invention, the output of the power supply is input to a linear regulator, which outputs a regulated voltage. The regulated voltage is less than the output voltage, and the regulated voltage is output to a precision voltage reference generator. The unregulated voltage is input to the apparatus to determine the presence of a power fail condition.

According to yet another feature, the power supply comprises a non-volatile supply, and the regulated voltage is input to the non-volatile supply, such that the apparatus is switched to the non-volatile supply when the regulated voltage is not present.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
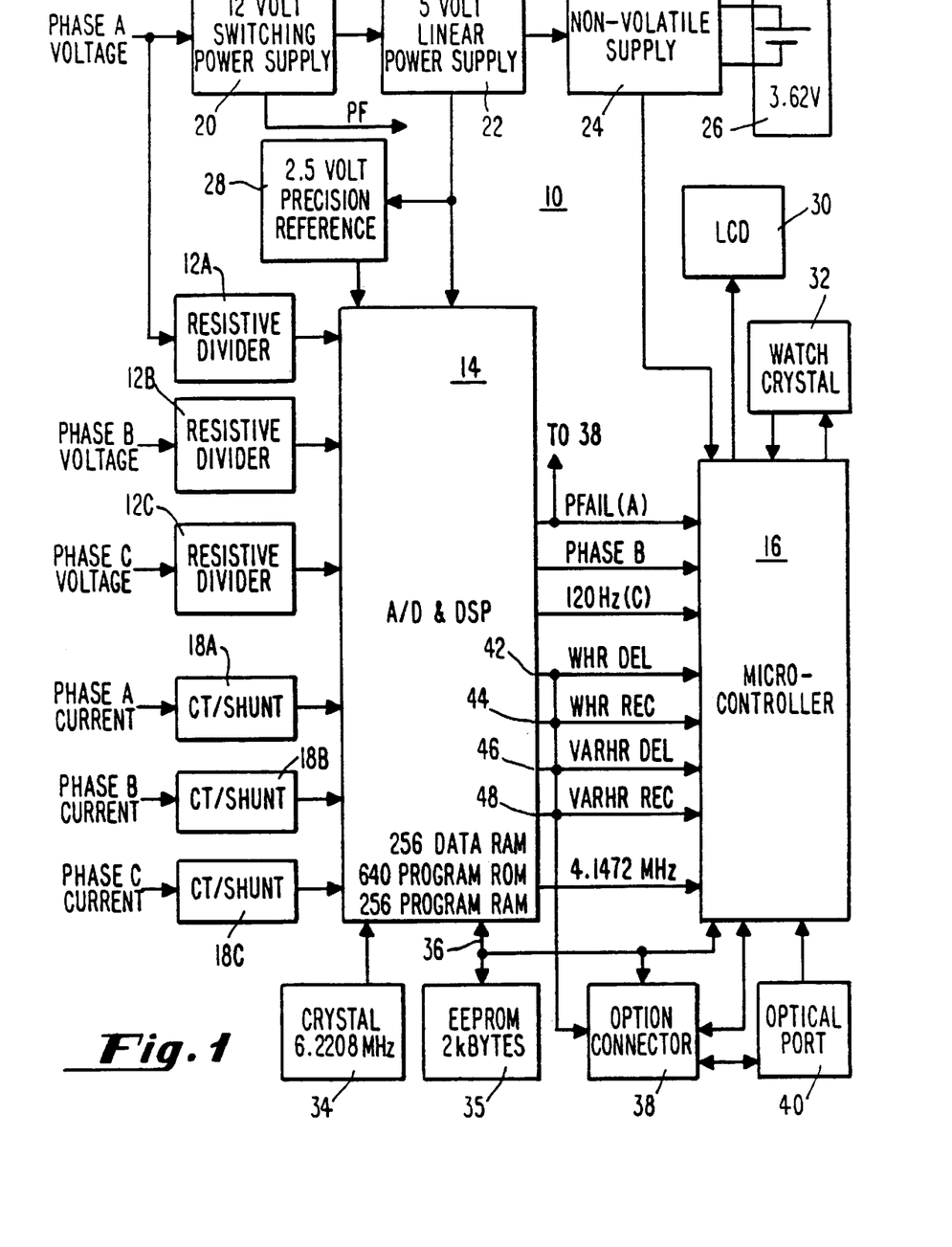
FIG. 1 is a block diagram of an electronic meter constructed in accordance with the present invention.

A new and novel meter for metering electrical energy is shown in FIG. 1 and generally designated 10. It is noted at the outset that this meter is constructed so that the future implementation of higher level metering functions can be supported.

Meter 10 is shown to include three resistive voltage divider networks 12A, 12B, 12C; a first processor—an ADC/DSP (analog-to-digital converter/digital signal processor) chip 14; a second processor—a microcontroller 16 which in the preferred embodiment is a Mitsubishi Model 50428 microcontroller; three current sensors 18A, 18B, 18C; a 12V switching power supply 20 that is capable of receiving inputs in the range of 96–528V; a 5V linear power supply 22; a non-volatile power supply 24 that switches to a battery 26 when 5V supply 22 is inoperative; a 2.5V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kByte EEPROM 35; a serial communications line 36; an option connector 38; and an optical communications port 40 that may be used to read the meter. The inter-relationship and specific details of each of these components is set out more fully below.

It will be appreciated that electrical energy has both voltage and current characteristics. In relation to meter 10 voltage signals are provided to resistive dividers 12A–12C and current signals are induced in a current transformer (CT) and shunted. The output of CT/shunt combinations 18A–18C is used to determine electrical energy.

First processor 14 is connected to receive the voltage and current signals provided by dividers 12A–12C and shunts 18A–18C. As will be explained in greater detail below, processor 14 converts the voltage and current signals to voltage and current digital signals, determines electrical energy from the voltage and current digital signals and generates an energy signal representative of the electrical energy determination. Processor 14 will always generate a watthour delivered (Whr Del) and, watthour received (Whr Rec), depending on the type of energy being metered, will generate either a volt amp reactive hour delivered (Varhr Del)/a volt amp reactive hour received (Varhr Rec) signal or volt amp hour delivered (Vahr Del)/volt amp hour received (Vahr Rec) signal. In the preferred embodiment, each transition on conductors 42–48 (each logic transition) is representative of the measurement of a unit of energy. Second processor 16 is connected to first processor 14. As will be explained in greater detail below, processor 16 receives the energy signal(s) and generates an indication signal representative of said energy signal.

It will be noted again that meter 10 is a wide range meter capable of metering over a voltage range from 96–528V. The components which enhance such a wide range meter include the divider network 12A–12C, which as previously noted are connected to receive the voltage component. The dividers generate a divided voltage, wherein the divided voltage is substantially linear voltage with minimal phase shift over the wide dynamic range, i.e. 96–528 Volts. A processing unit (processors 14 and 16) are connected to receive the divided voltage and the current component. The processing unit processes the divided voltages and the current components to determine electrical energy metering values. It will be appreciated from the following description that processors 14 and 16 require stable supply voltages to be operable. A power supply, connected to receive the voltage component and connected to processors 14 and 16, generate the necessary supply voltages from the Phase A voltage component over the wide dynamic range. Power supply 20 could also run off of phase B and phase C voltages or a combination of the above. However, a combination embodiment would require additional protection and rectifying components.

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Processor 14 is essentially a programmable digital signal processor (DSP) with built in multiple analog to digital (A/D) converters. The converters are capable of sampling multiple input channels simultaneously at 2400 Hz each with a resolution of 21 bits and then the integral DSP performs various calculations on the results. For a more detailed description of Processor 14, reference is made to U.S. Pat. No. 5,555,508, which is incorporated herein by reference and which is owned by the same assignee as the present application.

Meter 10 can be operated as either a demand meter or as a time-of-use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A–12C for all three phases, the shunt resistor portion of 18A–18C, oscillator 34, processor 14, processor 16, reset circuitry, EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35. The additional time-of-use billing data is stored in the internal RAM of processor 16, which RAM is backed by battery 26.

Consider now the various components of meter 10 in greater detail. Primary current being metered may be sensed using conventional current transformers. The shunt resistor portion of devices 18A–18C are located on the electronics assembly.

The phase voltages are brought directly to the electronic assembly where resistive dividers 12A–12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

Figure 2:
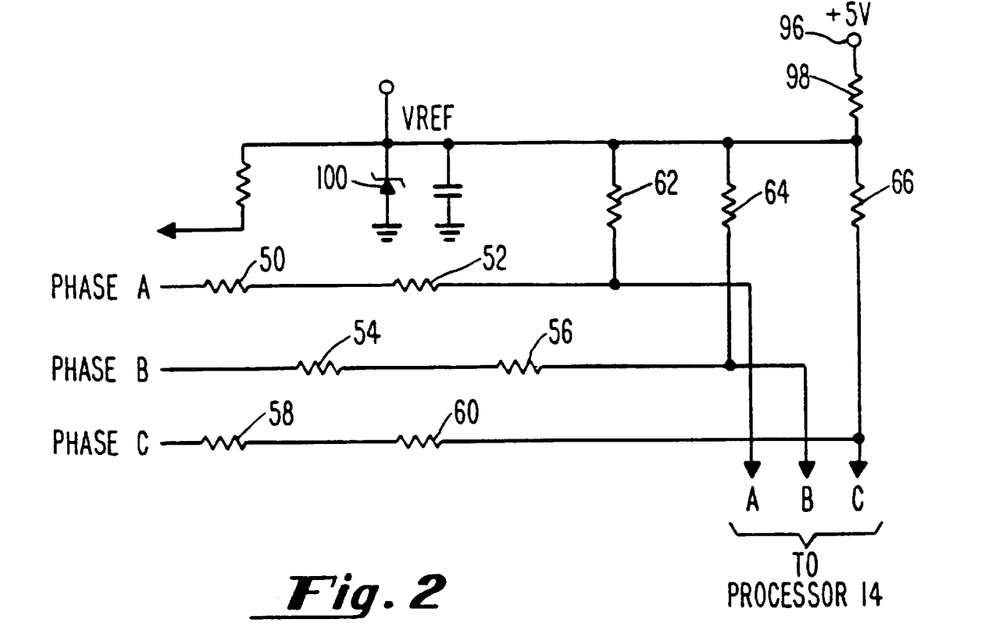
FIG. 2 is a schematic diagram of the resistive dividers shown in FIG. 1.
Figure 3:
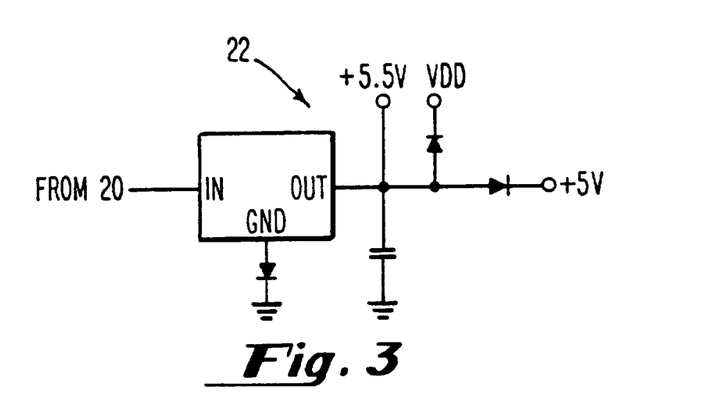
FIG. 3 is a schematic diagram of the linear power supply shown in FIG. 1.

Referring briefly to FIG. 2, each resistive divider consists of two 1 Meg, ½ watt resistors 50/52, 54/56 and 58/60, respectively. Resistors 50–60 are used to drop the line voltage at an acceptable watt loss. Each resistor pair feeds a resistor 62, 64 and 66, respectively. Resistors 62–66 are metal film resistors having a minimal temperature coefficient. This combination is very inexpensive compared to other voltage sensing techniques. Resistors 50–60 have an operating voltage rating of 300 Vrms each. These resistors have been individually tested with the 6 kV IEEE 587 impulse waveforms to assure that the resistance is stable and that the devices are not destroyed. Resistors 62–66 scales the input voltage to be less than 1 Volt peak to peak to processor 14. Resistors 62–66 should be in the range of from about 100 ohms to about 1 K ohms to assure this maximum voltage and maintain maximum signal.

On grounded, three wire delta systems, those components of the electronics assembly operating on logic voltage levels (including the battery connector) can be at an elevated voltage. In such situations, the two, 1 Meg resistor combinations (50/52, 54/56, 58/60) provide current limiting to the logic level electronics. The worse case current occurs during testing of a 480 V, 3 wire delta meter with single phase excitation.

It will be appreciated that energy units are calculated in processor 14 primarily from multiplication of voltage and current. The preferred embodiment of processor 14, referenced above as being described in U.S. Pat. No. 5,555,508 includes three analog to digital converters. The necessity for three converters is primarily due to the absence of voltage transformers, present in prior meters.

The M37428 microcontroller 16 is a 6502 (a traditional 8 bit microprocessor) derivative with an expanded instruction set for bit test and manipulation. This microcontroller includes substantial functionality including internal LCD drivers (128 quadraplexed segments), 8 kbytes of ROM, 384 bytes of RAM, a full duplex hardware UART, 5 timers, dual clock inputs (32.768 kHz and up to 8 MHz), and a low power operating mode.

During normal operation, processor 16 receives the 4.1472 MHz clock from processor 14 as described above. Such a clock signal translates to a 1.0368 MHz cycle time. Upon power fail, processor 16 shifts to the 32.768 kHz crystal oscillator 32. This allows low power operation with a cycle time of 16.384 kHz. During a power failure, processor 16 keeps track of time by counting seconds and rippling the time forward. Once processor 16 has rippled the time forward, a WIT instruction is executed which places the unit in a mode where only the 32.768 kHz oscillator and the timers are operational. While in this mode a timer is setup to "wake up" processor 16 every 32,768 cycles to count a second.

Consider now the particulars of the power supplies shown in FIG. 1. As indicated previously, the off-line switching supply 20 is designed to operate over a 96–528 VAC input range. It connects directly to the Phase A voltage alternating current (AC) line and requires no line frequency transformer. A flyback converter serves as the basis of the circuit. A flyback converter is a type of switching power supply.

As used herein, the "AC cycle" refers to the 60 Hz or 50 Hz input to power supply 20. The "switching cycle" refers to the 50 kHz to 140 kHz frequency at which the switching transformer of power supply 20 operates. It will be noted that other switching cycle frequencies can be used.

Figure 4:
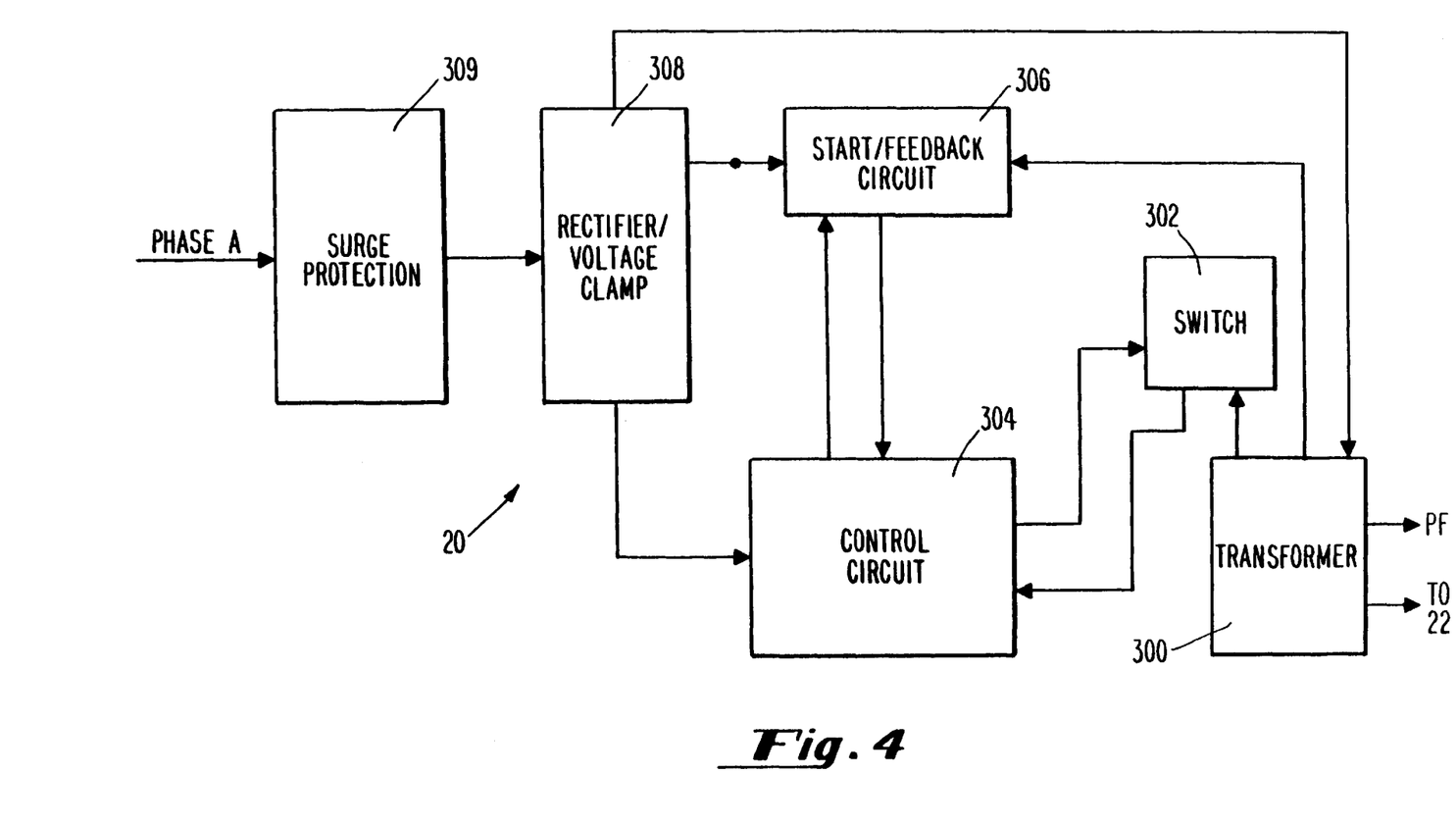
FIG. 4 is a block diagram of the power supply shown in FIG. 1.

Referring now to FIG. 4, power supply 20 for use in electronic meters includes a transformer 300 having primary and secondary windings. The input voltage (Phase A Voltage) is provided to the primary winding so that current may flow therethrough. As will be appreciated from FIG. 5, the secondary winding defines the output of the power supply. Referring back to FIG. 4, a switching member 302 is connected to the primary winding of transformer 300. Switching member 302 permits and prevents the flow of current through the primary winding. Switch member 302 is operable in response to a control signal, which control signal is generated by control circuit 304. Controller 304 generates the control signal in response to a limit signal generated by the start/feedback circuit 306 in response to the output of power supply 20. Voltage clamp 308 serves to limit the voltage applied to transformer 300 and switch 302. Surge protection circuit 309 is provided at the input to protect against surges appearing in the Phase A voltage.

Figure 5:
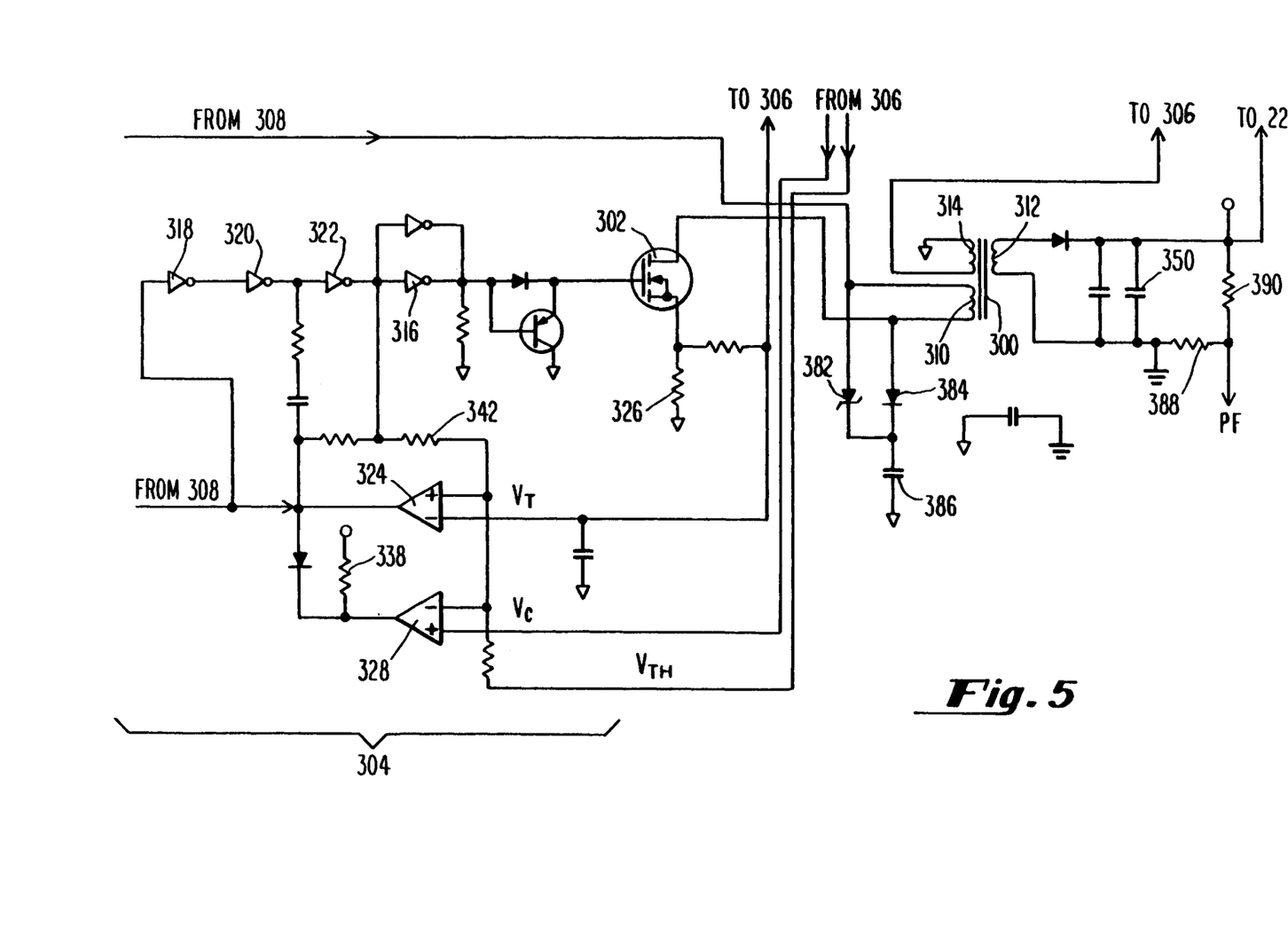
FIG. 5 is a schematic diagram of the control and switching members shown in FIG. 4.

Referring now to FIG. 5, transformer 300 and switch 302 are shown in greater detail. It will be appreciated that switch 302 is a transistor. At the beginning of each switching cycle, transistor 302 "turns on", i.e. becomes conductive, and magnetizes the core of transformer 300 by applying voltage across the primary 310. At the end of each cycle, transistor 302 turns off and allows the energy stored in the core of transformer 300 to flow to the output of the power supply, which "output" can be generally defined by secondary 312. Simultaneously, energy flows out of the bootstrap or tertiary winding 314 to power the control circuitry 304.

Feedback circuit 306 and controller 304 control the output of power supply 20 by varying the ON time of transistor 302. Controller 304 will be described in greater detail in relation to FIG. 5. Transistor 302 is connected through inverter 316 to receive the output of an oscillator formed from inverters 318, 320 and 322. It will be recognized that such inverters form a ring oscillator. The oscillator has a free-run frequency of 50 KHz. The ON time of transistor 302 may vary between 200 ns and 10 $\mu$s. The OFF time is always between 8 and 10 $\mu$s. During operation, the bootstrap winding 314 of transformer 300 (pins 10 and 11) powers controller 304, but this power is not available until the power supply has started. The control circuit is a current-mode regulator.

At the beginning of a switching cycle, transistor 302 is turned ON by the oscillator output. If left alone, transistor 302 would also be turned OFF by the oscillator output. Transistor 302 remains ON until the current in primary 310 of transformer 300 (pins 8 and 13) ramps up to the threshold current level $I_{th}$ represented as a voltage $V_{th}$. As will be explained below, $V_{th}$ is generated by feedback circuit 306. When the primary current of transformer 300, represented as a voltage $V_t$ and sensed by resistor 326, ramps up to the threshold level $V_{th}$, pin 1 of comparator 324 terminates the ON period of the oscillator by forcing the oscillator output HIGH, which output in turn is inverted by inverter 316, shutting OFF transistor 302. Transistor 302 then turns OFF until the next switching cycle. Since the $V_{th}$ indirectly controls the ON time of transistor 302, controller 304 regulates the output voltage of the power supply by comparing the sensed current in transformer 300 to this threshold level.

Transistor 362 and pin 7 of comparator 326 can disable the oscillator. Transistor 362, described in greater detail in FIG. 7, disables the oscillator when the line voltage exceeds 400 volts. Comparator 328 disables the oscillator when the controller 304 has insufficient voltage to properly drive transistor 302. The voltage in controller 304, $V_C$, will be described in relation to FIG. 5.

Figure 6:
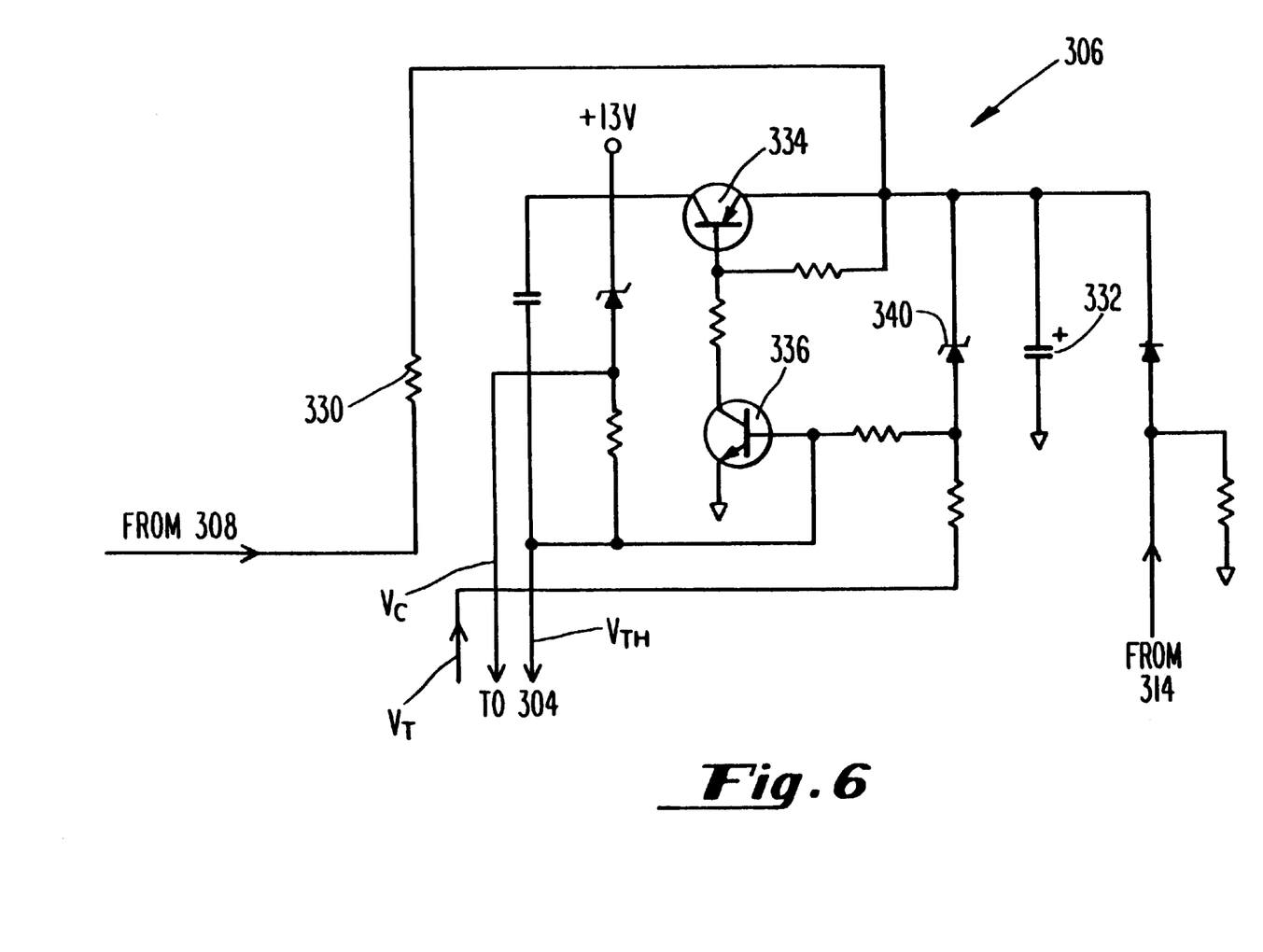
FIG. 6 is a schematic diagram of the startup/feedback shown in FIG. 4.

Consider now feedback circuit 306, shown in FIG. 6. When connected to the Phase A Voltage, resistor 330 slowly charges capacitor 332. The high value of resistor 330 and the 400 volt limit by voltage clamp 308 limit the power dissipation of resistor 330. After a few seconds, capacitor 332 charges above 13 volts. Transistors 334 and 336 then provide positive feedback to each other and snap ON. Controller 304 can run for tens of milliseconds from the charge stored in capacitor 332. Normally, power supply 20 will successfully start and begin to power itself in this period. If it fails to start, transistors 334 and 336 turn OFF when the charge across capacitor 332 drops below 8.5 volts and capacitor 332 again charges through resistor 330. This cycle repeats until the supply starts.

With high input voltages and without resistor 338 (FIG. 5), the current sourced by resistor 330 can hold the control and start-up circuits in a disabled state that does not recycle. When Capacitor 332 drops below 8.5 volts, resistor 338 places a load on the control circuit supply. This load insures that the start-up circuit recycles properly with high input voltages.

As indicated above, when the primary current of transformer 300 sensed by resistor 326 ramps up to the threshold level $V_{th}$, pin 1 of comparator 324 can terminate the ON period of the oscillator. When the voltage on capacitor 332 is less than 13 volts, zener diode 340 provides no voltage feedback. Under these conditions, the base-emitter voltage of transistor 336 sets the current threshold $I_{th}$ to about 650 mA. This maximum current limit protects transistor 302, as well as those transistors in voltage clamp 306, and prevents transformer 300 from saturating.

As the voltage on capacitor 332, which is representative of the output voltage of the supply, approaches the proper level, zener diode 340 begins to conduct and effectively reduces the current threshold, i.e. effectively reduces $V_{th}$. Each switching cycle will then transfers less power to the output, and the supply begins to regulate its output.

When the regulating circuitry requires ON times of transistor 302 less than about 400 ns, the current sense circuitry does not have time to react to the primary current of transformer 300. In that case, the regulating circuit operates as a voltage-mode pulse width modulator. Resistor 342 (FIG. 5) generates a negative step at pin 3 of comparator 324 at the beginning of each switching cycle. The regulator feedback voltage at pin 2 of comparator 324, which contains little current information at the beginning of each switching cycle, translates the step at pin 3 into various input overdrives of comparator 324, thereby driving the output of comparator 324 to a logic HIGH level. The propagation time of the comparator 324 decreases with increasing overdrive, i.e. as the negative step increases, and the circuit acts as a pulse width modulator. The negative step will increase due to the changing level of $V_{th}$.

Any leakage inductance between the bootstrap winding (pins 10 and 11 of transformer 300) and the output winding (pins 3 and 4 of transformer 300) causes inaccurate tracking between the voltage on capacitor 332 and the output voltage of the supply. This leakage inductance can cause poor load regulation of the supply. The bootstrap and output windings are bifilar wound; they are tightly coupled, have little leakage inductance, and provide acceptable load regulation. Since the two windings are in direct contact, the bootstrap winding requires Teflon insulation to meet the isolation voltage specifications. A 100% hi-pot test during manufacture insures the integrity of the insulation.

Figure 7:
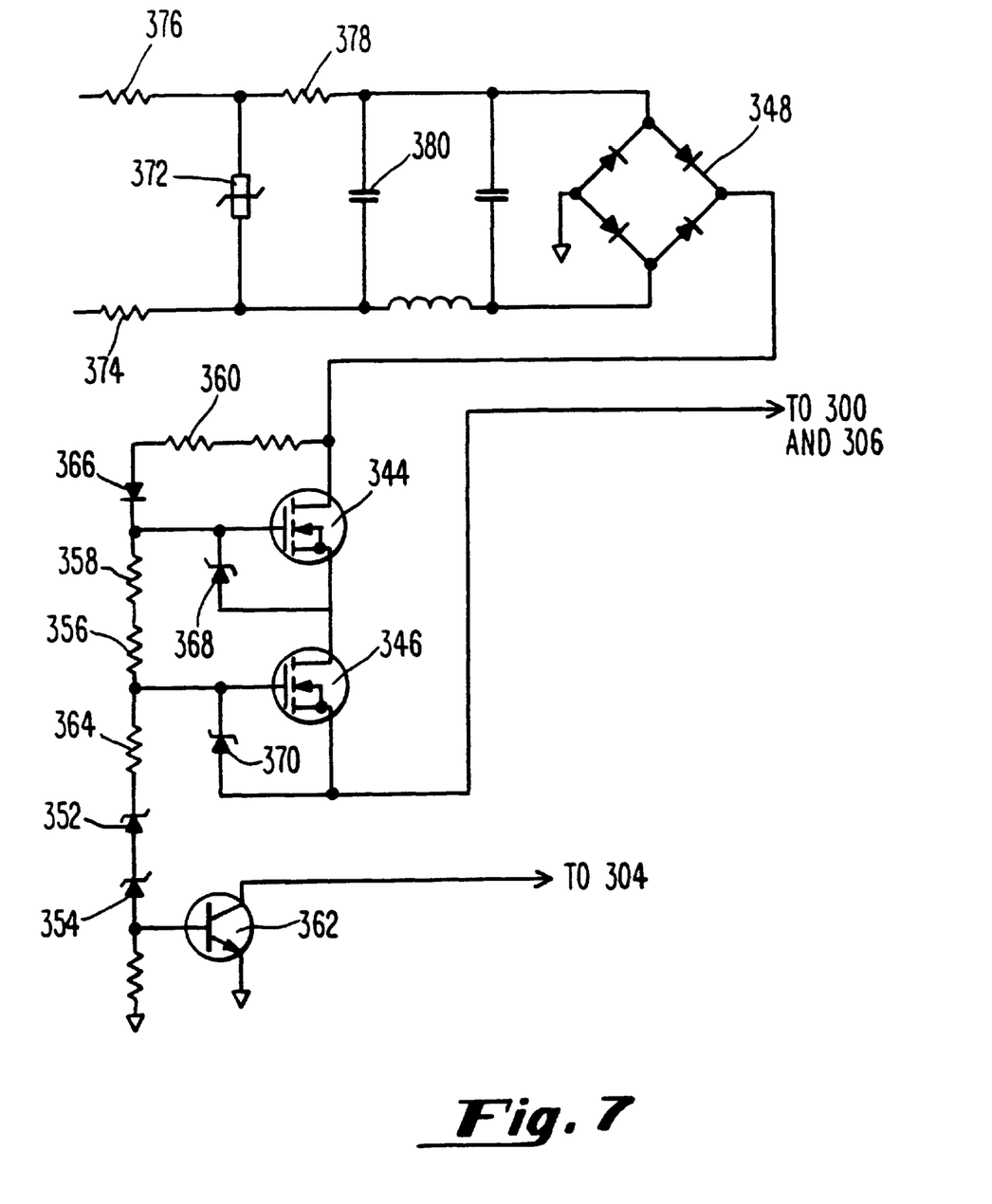
FIG. 7 is a schematic diagram of the voltage clamp shown in FIG. 4.

Consider now the details of voltage clamp 308, shown in FIG. 7. A 528 VAC input corresponds to 750 VDC after rectification. Switching transistors that can directly handle these voltages are extremely expensive. By using the voltage clamp of the present invention, relatively inexpensive switching transistors can be utilized.

In power supply 20, the switching member 302 is shut down during parts of the AC cycle that exceed 400 volts. The switching transistor, transistor 302, in conjunction with two other transistors 344 and 346, can hold off 750 VDC. During surge conditions, these three transistors can withstand over 1500 volts. In the preferred embodiment, transistors 302, 344 and 346 are 600-volt MOSFETs.

Because high-voltage electrolytic capacitors are expensive and large, this voltage clamp 308 has no bulk filter capacitor after the bridge rectifier 348. Without a bulk filter capacitor, this switching converter must shut down during parts of the AC cycle. It intentionally shuts down during parts of the AC cycle that exceed 400 volts, and no input power is available when the AC cycle crosses zero. The 2200 $\mu$F output capacitor 350 (FIG. 5), provides output current during these periods.

As discussed above, transistors 344 and 346 act as a voltage clamp and limit the voltage applied to switching member 302. At a 528 VAC line voltage, the input to the clamping circuit reaches 750 volts. During lightning-strike surges, this voltage may approach 1500 volts. When the voltage at the output of bridge rectifier 348 exceeds 400 volts, zener diodes 352 and 354 begin to conduct. These diodes, along with the 33 K$\Omega$ resistors 356, 358 and 360, create bias voltages for transistors 344 and 346. Transistors 344 and 346 act as source followers and maintain their source voltages a few volts below their gate voltages.

If, for example, the output of bridge rectifier 348 is at 1000 volts, the gates of transistors 344 and 346 will be at approximately 400 and 700 volts respectively. The source of transistor 344 applies roughly 700 volts to the drain of 346; the source of 346 feeds about 400 volts to switching member 302. Transistors 344 and 346 each drop 300 volts under these conditions and thereby share the drop from the 1000 volt input to the 400 volt output, a level which the switching converter 302 can withstand.

As zener diodes 352 and 354 begin to conduct and as transistors 344 and 346 begin to clamp, transistor 362 turns ON and shuts down the switching converter. Although transistors 344 and 346 limit the voltage fed to the converter to an acceptable level, they would dissipate an excessive amount of heat if the switching converter 302 consumed power during the clamping period.

When switching converter 302 shuts down, transistor 302 no longer has to withstand the flyback voltage from transformer 300. Resistor 364 takes advantage of this by allowing the output voltage of the clamp to approach 500 volts (instead of 400 volts) as the input to the clamp approaches 1500 volts. This removes some of the burden from transistors 344 and 346.

Zener diodes 352 and 354 are off and the converter 302 runs when the output of bridge rectifier 348 is below 400 volts. During these parts of the AC cycle, the 33 K$\Omega$ resistors 356, 358 and 360 directly bias the gates of transistors 344 and 346. The voltage drop across transistors 344 and 346 is then slightly more than the threshold voltages of those transistors along with any voltage drop generated by the channel resistance of those transistors.

During the off time of transistor 302, about 10 $\mu$S, the 33 K$\Omega$ resistors can no longer bias the gates of transistors 344 and 346. Diode 366 prevents the gate capacitance of transistors 344 and 346 and the junction capacitance of zeners 368 and 370 from discharging when transistor 302 is off. This keeps transistors 344 and 346 ON and ready to conduct when transistor 302 turns ON at the next switching cycle. If the gates of transistors 344 and 346 had discharged between switching cycles, they would create large voltage drops and power losses during the time required to recharge their gates through the 33 K$\Omega$ resistors.

In the preferred embodiment, two 33 K$\Omega$ resistors are used in series to obtain the necessary voltage capability from 966 surface-mount packages.

This power supply must withstand an 8 KV, 1.2×50 $\mu$S short-branch test. Varistor 372, resistors 374, 376 and 378, and capacitor 380 protect the power supply from lightning strike surges.

A 550 VAC varistor 372 serves as the basis of the protection circuit. It has the lowest standard voltage that can handle a 528 VAC input. The device has a maximum clamping voltage of 1500 volts at 50 amps.

A varistor placed directly across an AC line is subject to extremely high surge currents and may not protect the circuit effectively. High surge currents can degrade the varistor and ultimately lead to catastrophic failure of the device. Input resistors 374 and 376 limit the surge currents to 35 amps. This insures that the clamping voltage remains below 1500 volts and extends the life of the varistor to tens of thousands of strikes.

Resistor 378 and capacitor 380 act as an RC filter. The filter limits the rate of voltage rise at the output of the bridge rectifier. The voltage clamping circuit, transistors 344 and 346, is able to track this reduced dv/dt. Current forced through diodes 382, 384 and capacitor 386 (FIG. 5) is also controlled by the limited rate of voltage rise.

Resistors 374 and 376 are 1 watt carbon composition resistors. These resistors can withstand the surge energies and voltages. Resistor 378 is a flame-proof resistor that acts as a fuse in the event of a failure in the remainder of the circuit.

The values of resistors 374, 376 and 378 are low enough so that they do not interfere with the operation of the power supply or dissipate excessive amounts of power.

Finally it is noted that resistors 388 and 390 act to generate the power fail voltage PF.

By using the wide voltage ranging of the invention, a single meter can be used in both a four wire wye application as well as in a four wire delta application. It will be recognized that a four wire delta application includes 96V sources as well as a 208V source. In the past such an application required a unique meter in order to accomodate the 208V source. Now all sources can be metered using the same meter used in a four wire wye application.

While the invention has been described and illustrated with reference to specific embodiments, those skilled in the art will recognize that modification and variations may be made without departing from the principles of the invention as described herein above and set forth in the following claims.

What is claimed is:

1. An apparatus for metering at least one selectable type of electrical power over a predetermined range of polyphase service voltages supplied by electrical service providers, said predetermined range of polyphase service voltages including at least two of 120 Vrms, 208 Vrms, 240 Vrms, 277 Vrms and 480 Vrms, said electrical power comprising a voltage component and a current component, said apparatus comprising:

a plurality of voltage input circuits, each being connected to receive a voltage component of one phase of any polyphase service voltage within said predetermined range of polyphase service voltages and to divide said voltage component to a divided voltage that is a substantially linear voltage having a substantially stable phase shift over said predetermined range of polyphase service voltages;

a plurality of current input circuits, each being connected to receive a current component associated with said one phase and to produce an induced current proportional to said current component;

a processing unit, connected to receive said divided voltage of each phase and said induced current of each phase to determine said at least one type of electrical power, wherein said processing unit is operable in response to a supply voltage and adapted to determine a plurality of types of electrical power; and a power supply, connected to said processing unit, which receives a voltage component of any polyphase service voltage within said predetermined range of polyphase voltages and generates said supply voltage from said voltage component of said predetermined phase, said apparatus comprising the same physical components when operating with any polyphase service voltage within said predetermined range of polyphase service voltages.

2. The apparatus as recited in claim 1, wherein said power supply comprises:

a transformer comprising first and second windings, wherein an input voltage is provided to said first winding so that current flows through said first winding and wherein said second winding defines the output of said power supply;

a switching device, connected to said first winding, for permitting and preventing the flow of current through said first winding, wherein said switching device is operable in response to a control signal; and a controller, connected to said switching device, for generating said control signal in response to the output of said power supply, wherein said power supply is connected to receive said voltage component of said predetermined phase as said input voltage.

3. The apparatus as recited in claim 2, said power supply further comprising a bridge rectifier and protection circuit connected to receive said input voltage, said bridge rectifier rectifying said input voltage to produce an unregulated voltage, and said protection circuit directing said input voltage away from said first winding and disabling said switching device when said input voltage exceeds a desired level.

4. The apparatus as recited in claim 3, said protection circuit comprising first and second transistors and a biasing device connected to said first and second transistors, wherein said biasing device biases said first and second transistors so that the voltage provided by said protection circuit does not exceed a desired level, and wherein said protection circuit is connected in series with said transformer and said switching member.

5. The apparatus as recited in claim 2, said transformer further comprising a third winding, wherein said third winding is substantially similar to said second winding so that the voltage across said third winding is similar to the voltage across said second winding.

6. The apparatus as recited in claim 5, wherein said controller generates said control signal based on the voltage across said third winding, and wherein said control signal operates to disable said switching member.

7. The apparatus as recited in claim 5, said controller comprising a current-mode regulator, wherein a current reference signal is generated by said current-mode regulator.

8. The apparatus as recited in claim 2, further comprising a charge storage device, connected to said second winding, which stores an electrical charge when current is flowing through said first winding and discharges stored electrical charge when said switching member interrupts current flowing through said first winding.

9. The apparatus as recited in claim 8, said output of said power supply being input to a regulator to produce said supply voltage wherein said supply voltage is a regulated voltage.

10. The apparatus as recited in claim 2, wherein said controller comprises an oscillator having a predetermined pulse width.

11. The apparatus as recited in claim 2, further comprising a non-volatile power source.

12. The apparatus as recited in claim 11, wherein said non-volatile power source comprises a battery or a capacitor.

13. The apparatus as recited in claim 1, further comprising a reference voltage generator which generates a reference voltage, wherein said voltage input circuit is connected to said reference voltage generator and wherein said voltage input circuit references said divided voltage to said reference voltage.

14. The electrical energy meter of claim 1, wherein said supply voltage is a fixed predetermined voltage that is generated by said power supply independent of the magnitude of said voltage component.

15. The electrical energy meter of claim 1, wherein said voltage component is between about 96 Vrms and about 528 Vrms.

16. The electrical energy meter of claim 1, wherein said power supply is operable with 120 Vrms standard service and 277 Vrms standard service without modification.

\* \* \* \* \*